(12) United States Patent
Noguchi et al.

(10) Patent No.: US 12,418,975 B2
(45) Date of Patent: Sep. 16, 2025

(54) ELECTRONIC MODULE, IMAGING UNIT AND EQUIPMENT

(71) Applicant: CANON KABUSHIKI KAISHA, Tokyo (JP)

(72) Inventors: Koji Noguchi, Tokyo (JP); Mitsutoshi Hasegawa, Kanagawa (JP); Satoru Higuchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 113 days.

(21) Appl. No.: 18/415,119

(22) Filed: Jan. 17, 2024

(65) Prior Publication Data

US 2024/0260167 A1   Aug. 1, 2024

(30) Foreign Application Priority Data

Jan. 27, 2023 (JP) ................... 2023-011144

(51) Int. Cl.
| | |
|---|---|
| *H05K 1/02* | (2006.01) |
| *H01L 23/00* | (2006.01) |
| *H01L 23/498* | (2006.01) |
| *H01R 12/62* | (2011.01) |

(Continued)

(52) U.S. Cl.
CPC ..... *H05K 1/0201* (2013.01); *H01L 23/49838* (2013.01); *H01R 12/62* (2013.01);
(Continued)

(58) Field of Classification Search
CPC .......... H05K 1/0201; H05K 1/181; H05K 2201/09854; H05K 2201/10015; H05K 2201/10022; H05K 2201/10068; H05K 2201/062; H05K 1/0253; H05K 1/147; H05K 2201/0969; H05K 2201/10151; H05K 3/363; H05K 1/0207; H01L 23/49838; H01L 24/48; H01L 2224/48091;

(Continued)

(56) References Cited

U.S. PATENT DOCUMENTS

| | | |
|---|---|---|
| 9,421,628 B2 | 8/2016 | Higuchi |
| 10,582,615 B2 | 3/2020 | Noguchi |

(Continued)

FOREIGN PATENT DOCUMENTS

| | | |
|---|---|---|
| JP | 2008-140916 A | 6/2008 |
| JP | 2011-171352 A | 9/2011 |
| JP | 2020-120106 A | 8/2020 |

*Primary Examiner* — Padma Haliyur
(74) *Attorney, Agent, or Firm* — VENABLE LLP

(57) ABSTRACT

A printed wiring board has a first conductive layer including a second electrode group bonded to a first electrode group of a flexible printed circuit board, and a second conductive layer, and a plane including the second conductive layer includes a first region including a reference region set in a bonded portion, a second region via a first boundary, and a third region via a second boundary, and a first boundary portion is positioned within a range of 0.5 times or more and 5 times or less a length of a short side of four sides in a prescribed direction, and a second boundary portion is positioned within a range of 0.5 times or more and 5 times or less the length of the short in a prescribed direction, and a density of the second conductive layer in the first region is higher than that in the second region.

21 Claims, 8 Drawing Sheets

(51) Int. Cl.
   *H04N 23/51*   (2023.01)
   *H04N 23/52*   (2023.01)
   *H04N 23/54*   (2023.01)
   *H05K 1/18*    (2006.01)

(52) U.S. Cl.
   CPC ............. *H04N 23/51* (2023.01); *H04N 23/52* (2023.01); *H04N 23/54* (2023.01); *H01L 24/48* (2013.01); *H01L 2224/48091* (2013.01); *H01L 2224/48227* (2013.01); *H05K 1/181* (2013.01); *H05K 2201/09854* (2013.01); *H05K 2201/10015* (2013.01); *H05K 2201/10022* (2013.01); *H05K 2201/10068* (2013.01)

(58) Field of Classification Search
   CPC .......... H01L 2224/48227; H01R 12/62; H04N 23/51; H04N 23/52; H04N 23/54
   See application file for complete search history.

(56) References Cited

U.S. PATENT DOCUMENTS

| | | | |
|---|---|---|---|
| 10,897,820 | B2 | 1/2021 | Noguchi |
| 11,595,557 | B2 | 2/2023 | Okada |
| 11,765,832 | B2 | 9/2023 | Hasegawa |
| 11,877,392 | B2 | 1/2024 | Hasegawa |
| 11,895,793 | B2 | 2/2024 | Noguchi |
| 2020/0154016 | A1* | 5/2020 | Takakura ............ H05K 1/0218 |
| 2020/0170112 | A1 | 5/2020 | Matsumaru |
| 2021/0014391 | A1 | 1/2021 | Uemura et al. |
| 2022/0020807 | A1 | 1/2022 | Hasegawa |
| 2022/0346219 | A1 | 10/2022 | Hasegawa et al. |
| 2022/0353995 | A1* | 11/2022 | Tsuboi ................ H05K 3/3452 |
| 2023/0188822 | A1 | 6/2023 | Okada |
| 2023/0223713 | A1 | 7/2023 | Hasegawa |

* cited by examiner

ELECTRONIC MODULE, IMAGING UNIT AND EQUIPMENT

BACKGROUND OF THE INVENTION

Field of the Invention

The present invention relates to an electronic module, an imaging unit, and equipment.

Description of the Related Art

A technique of connecting a flexible printed board to a rigid printed wiring board by soldering is known. In such technical field, a heat generation problem that heat generation due to a resistance loss occurs at a solder bonded portion by improving performance of equipment and speeding up a signal flowing through a flexible printed board becomes significant.

Further, influence of heat on an active component such as ICs (Integrated Circuits), crystals, and the like arranged around the flexible printed board has been considered as a problem.

With the narrowing of the pitch of the flexible printed board, it is difficult to radiate heat by increasing the copper foil area of the solder bonded portion, and it is required to radiate heat not only in the surface layer but also in the inner layer of the substrate. At the same time, suppression of influence of heat on a peripheral component is also an important problem.

Japanese Patent Application Laid-Open No. 2020-120106 discloses an imaging unit in which a flexible printed circuit board is connected to a printed wiring board via solder.

In the technique described in Japanese Patent Application Laid-Open No. 2020-120106, there is room for improvement in the heat dissipation structure of the printed wiring board and the flexible printed circuit board.

SUMMARY OF THE INVENTION

Accordingly, it is an object of the present invention to provide a technique capable of reducing the influence of heat on an electronic component mounted on a printed wiring board and improving heat dissipation in an electronic module in which a flexible printed board is connected to a printed wiring board by soldering.

According to one aspect of the present invention, there is provided an electronic module including: a flexible printed circuit board having a first electrode group; a printed wiring board having a second electrode group; and an electronic component mounted on the printed wiring board, wherein the printed wiring board includes a first conductive layer formed to include the second electrode group and a second conductive layer formed under the first conductive layer, wherein the first electrode group and the second electrode group are bonded by solder, wherein a plane including the second conductive layer includes a first region, a second region in contact with the first region via a first boundary, and a third region in contact with the second region via a second boundary in a plan view with respect to the plane, wherein the first region includes a reference region having a contour of a rectangle, and the reference region is set such that four sides of the rectangle are circumscribed to a bonded portion where the first electrode group and the second electrode group are bonded to each other in the plan view, wherein a first boundary portion, which is at least a part of the first boundary, is positioned within a range of 0.5 times or more and 5 times or less a length of a short side of the four sides in one direction from one side of the four sides of the reference region toward the outside of the reference region, wherein a second boundary portion, which is at least a part of the second boundary, is positioned within a range of 0.5 times or more and 5 times or less the length of the short side in the one direction from the first boundary portion, and wherein a density of the second conductive layer in the first region is higher than a density of the second conductive layer in the second region, and the electronic component is arranged on the third region.

Further features of the present invention will become apparent from the following description of exemplary embodiments with reference to the attached drawings.

DESCRIPTION OF THE EMBODIMENTS

Figure 1A:
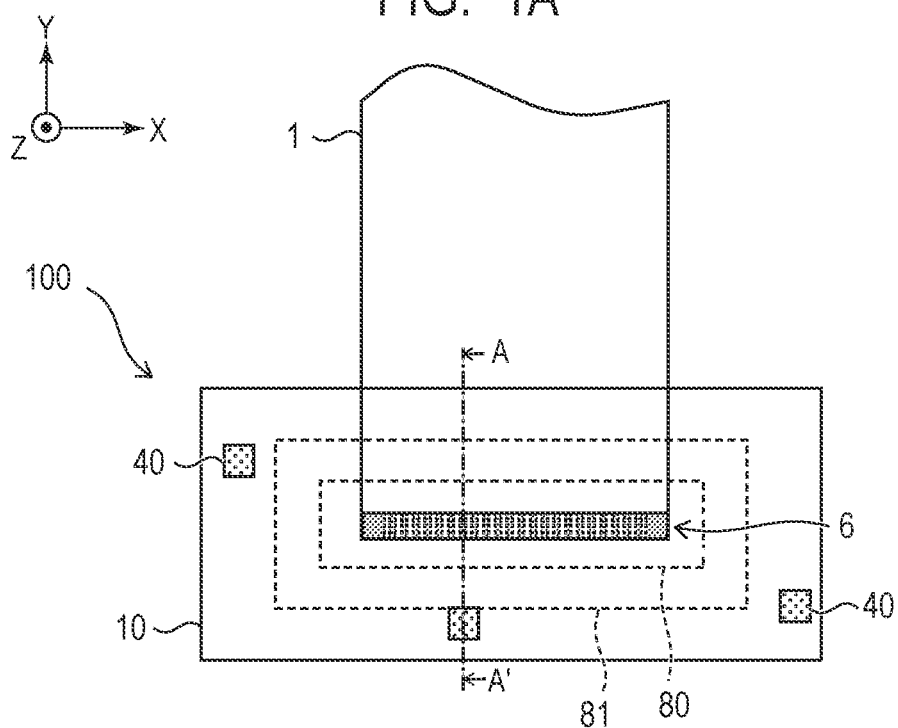
FIG. 1A, FIG. 1B, and FIG. 1C are a schematic diagram illustrating an electronic module according to a first embodiment.

Embodiments for implementing the present invention will be described in detail below with reference to the drawings. Note that the present invention is not limited to the embodiments described below and can be changed as appropriate within the scope not departing from the spirit of the present invention. Further, in the drawings described below, components having the same function are labeled with the same reference symbols, and the description thereof may be omitted or simplified.

First Embodiment

Figure 1B:
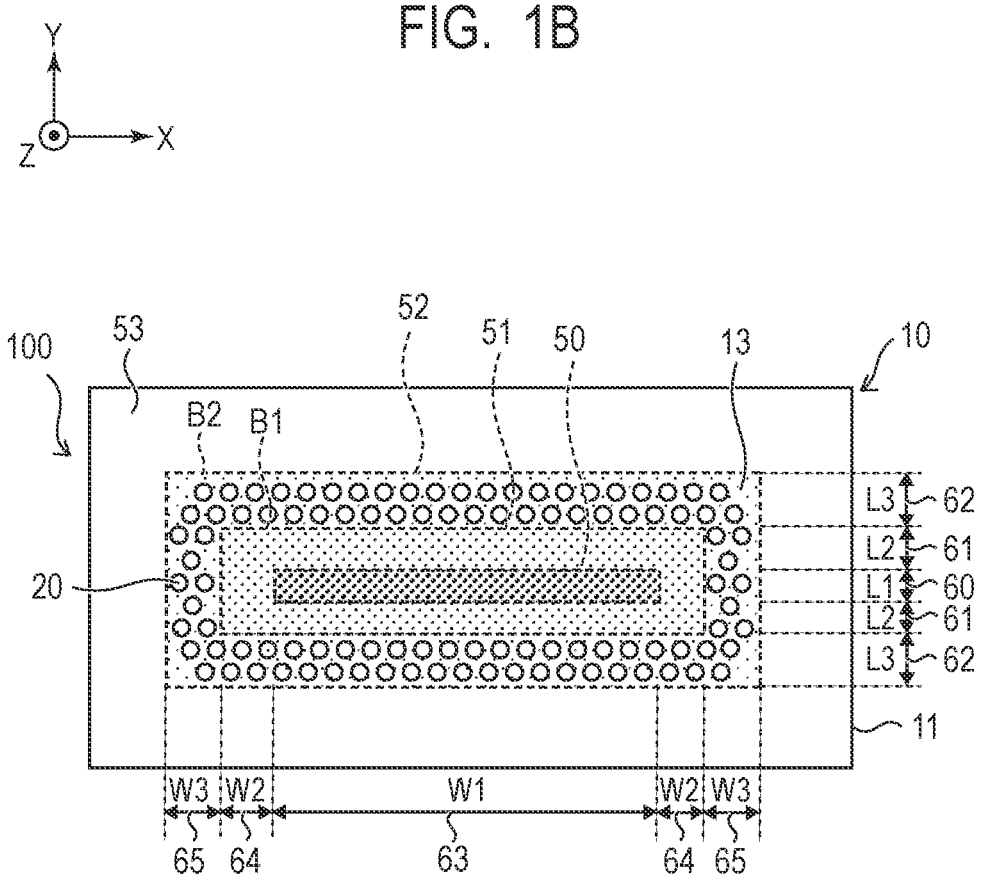
Figure 1C:
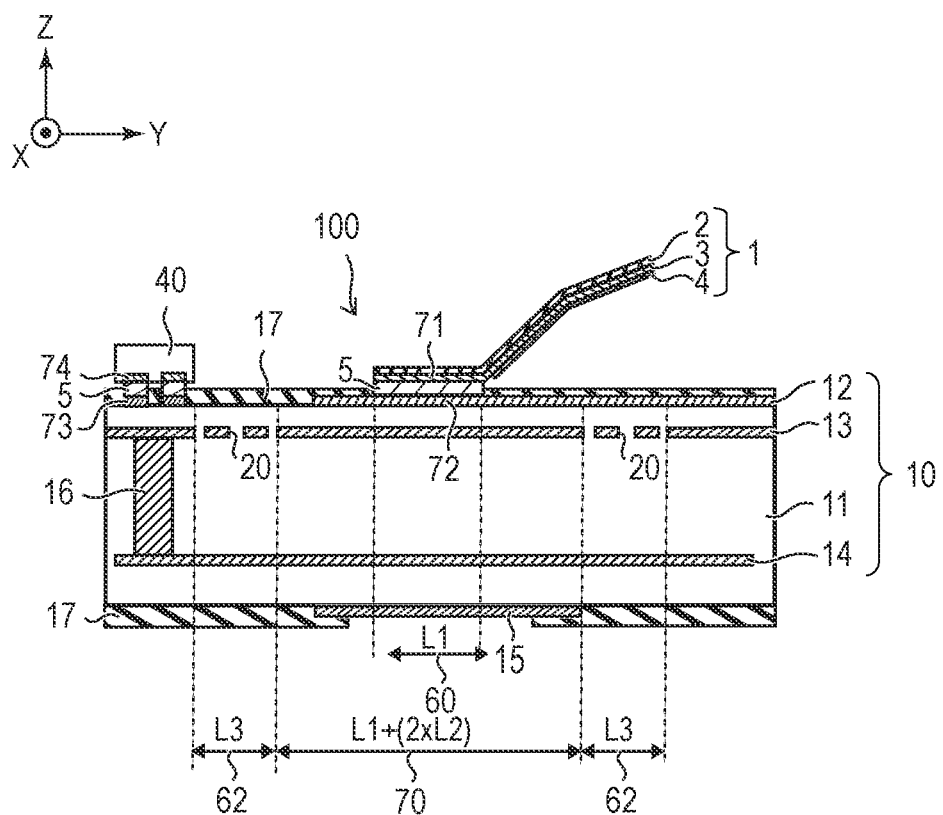

An electronic module 100 according to a first embodiment will be described with reference to FIGS. 1A to 1C. FIG. 1A is a top plan view of the electronic module 100. FIG. 1B is a plan view illustrating a second conductive layer 13 of a second layer from a surface layer when the electronic module 100 is viewed from the top. FIG. 1C is a cross-sectional view taken along a line A-A' in FIG. 1A.

As illustrated in FIGS. 1A to 1C, the electronic module 100 according to the present embodiment includes a printed wiring board 10, a flexible printed circuit board 1, and peripheral components 40. As will be described later, the peripheral components 40 and the flexible printed circuit board 1 are connected to the printed wiring board 10 by solder bonding via the solder 5, respectively.

Here, the coordinate axes and directions of the X-axis, the Y-axis, and the Z-axis of an XYZ coordinate system, which is an orthogonal coordinate system used in the following description, are defined. First, an axis perpendicular to the main surface of the printed wiring board 10 is defined as the Z axis. Further, an axis parallel to the main surface of the printed wiring board 10 and along the long sides of a pair of parallel edges of the printed wiring board 10 is defined as the X axis. An axis orthogonal to the X-axis and the Z-axis is defined as the Y-axis. In the XYZ coordinate system in which the coordinate axes are defined in this manner, a direction along the X axis is defined as an X direction, and among the X directions, a direction from one end of the printed wiring board 10 to the other end is defined as a +X direction, and a direction opposite to the +X direction is defined as a −X direction. Further, a direction along the Y axis is defined as a Y direction, and among the Y directions, a direction from the right side to the left side with respect to the +X direction is defined as a +Y direction, and a direction opposite to the +Y direction is defined as a −Y direction. Further, a direction along the Z axis is defined as a Z direction, and among the Z directions, a direction to the side of surface to which the flexible printed circuit board 1 of the printed wiring board 10 is connected from the opposite side is defined as a +Z direction, and a direction opposite to the +Z direction is defined as a −Z direction. FIGS. 1A and 1B are plan views of the electronic module 100 as viewed in the −Z direction from the side where the flexible printed circuit board 1 is connected, and FIG. 1C is a cross-sectional view of the electronic module 100 as viewed in the −Y direction.

The flexible printed circuit board 1 includes a flexible base 2, a flexible wiring layer 3, and a coverlay 4. The flexible printed circuit board 1 includes one or more conductive layers as the flexible wiring layer 3. In the flexible printed circuit board 1, the flexible wiring layer 3 as a conductive layer can be stacked on the flexible base 2 as an insulating layer via the flexible base 2. The flexible wiring layer 3 of a surface is covered with a coverlay 4. In the present embodiment, a case where the flexible wiring layer 3 in the flexible printed circuit board 1 is a single layer will be described, but the flexible wiring layer 3 is not limited to a single layer and may be multiple layers.

Although the flexible printed circuit board 1 has a planar shape of a rectangle in FIG. 1A, the planar shape of the flexible printed circuit board 1 is not limited to a shape of the rectangle. For example, the width of the flexible printed circuit board 1 maybe partially changed in the length direction, a protrusion may be formed near the electrode terminal of the flexible printed circuit board 1, or the flexible printed circuit board 1 may have a slit in it.

Further, although not illustrated, a single layer or multiple layers of a conductive shielding layer, a protective film, a reinforcing film, and the like may be formed on both or either one of the flexible base 2 and the coverlay 4 of the flexible printed circuit board 1. These layers may be formed so as to cover the entire surface of the flexible printed circuit board 1, or may be formed so as to cover a part of the flexible printed circuit board 1.

The flexible base 2 is a sheet-like or film-like insulating base made of a resin or the like, and has plasticity and flexibility. Therefore, the flexible printed circuit board 1 can be deformed such as bending or curving. The insulator forming the flexible base 2 may have electrical insulating property. For example, polyimide, polyethylene terephthalate, or the like is used as the insulator forming the flexible base 2.

The flexible wiring layer 3 is a conductive layer made of copper foil or other metal foil. The flexible wiring layer 3 has wiring patterns. The flexible wiring layer 3 is formed on one surface or both surfaces of the flexible base 2. The conductor forming the flexible wiring layer 3 is a material having higher conductivity and thermal conductivity than the insulator, and is a metal such as copper, silver, gold, or the like. The flexible wiring layer 3 maybe formed on at least one surface of the flexible base 2.

The coverlay 4 is an insulating layer for protecting a circuit formed by the flexible wiring layer 3. The coverlay 4 is formed of a cover film, an overcoat, or the like. The coverlay 4 is formed on the surface of the flexible base 2 on which the flexible wiring layer 3 is formed so as to cover the flexible wiring layer 3.

The coverlay 4 is not formed at one end of the flexible printed circuit board 1, and the flexible wiring layer 3 is exposed. A first electrode 71 is formed on an exposed portion of the flexible wiring layer 3. Further, gold, tin, or the like may be plated on the first electrode 71. A plurality of first electrodes 71 are arranged side by side at a predetermined pitch in the X direction. The plurality of first electrodes 71 form a first electrode group. Each of the plurality of first electrodes 71 has a planar shape of a rectangle having a short side along the X direction and a long side along the Y direction. All the first electrodes 71 may be arranged at the same pitch or at different pitches. Thus, the first electrode 71 is formed by the flexible wiring layer 3 exposed at the end portion of the flexible printed circuit board 1. Although not illustrated, an electrode may be formed in the same manner at the other end of the flexible printed circuit board 1, and the other end portion may be an inserting terminal. Further, on the surface of the coverlay 4, the flexible wiring layer 3 maybe partially exposed as an electrode for mounting a connector component in the form of surface mounting.

The printed wiring board 10 includes a printed wiring base 11, a plurality of conductive layers 12, 13, 14, and 15 as a plurality of wiring layers, and a solder resist layer 17. The printed wiring board 10 is configured such that the plurality of conductive layers 12, 13, 14, and 15 are stacked via the printed wiring base 11. Unlike the flexible printed circuit board 1, the printed wiring board 10 is a rigid wiring board. For example, the printed wiring board 10 maybe formed of a glass epoxy material or a ceramic substrate. Further, instead of the printed wiring board 10, a printed wiring board in which elements such as an imaging element are arranged on a ceramic substrate and the ceramic substrate and the printed wiring board are connected to each other by a pair of electrodes via solder can be used.

The printed wiring base 11 is an insulating base made of a rigid composite material or the like and shaped in a board, for example. Unlike the flexible base 2, the printed wiring base 11 is a rigid material. The insulator forming the printed wiring base 11 may have electrical insulation. For example, as the printed wiring base 11, a resin substrate obtained by curing a resin such as epoxy resin, a ceramic substrate using ceramic, or the like is used.

The conductive layers 12, 13, 14, and 15 as the wiring layers are conductive layers made of copper foil or other metal foil. In the printed wiring board 10, the wiring layers have wiring patterns. The wiring layer is formed on one surface or both surfaces of the printed wiring base 11. One or multiple wiring layers are also formed inside the printed wiring base 11.

FIG. 1C illustrates a case where the two conductive layers 12 and 15 are formed on both surfaces of the printed wiring base 11, the two conductive layers 13 and 14 are formed inside, and thus a total of four wiring layers are formed. In the present embodiment, the case where the wiring layers in the printed wiring board 10 are four layers will be described, but the present invention is not limited to four layers. The wiring layer in the printed wiring board 10 maybe a single layer or multiple layers, that is, may be four or less layers or four or more layers.

The conductive layer 12 is formed on the surface layer of the printed wiring board 10, that is, on one surface of the printed wiring base 11. The conductive layer 12 is a first conductive layer to which the flexible printed circuit board 1 is connected via the solder 5. The conductive layer 13 is a second conductive layer formed under the first conductive layer 12 inside the printed wiring base 11 from the conductive layer 12. In the following description, the conductive layer 13 is referred to as a "second conductive layer 13" as appropriate. The conductive layer 14 is a third conductive layer formed in a second layer inside the printed wiring base 11 from the conductive layer 12. The conductive layer 15 is a fourth conductive layer formed on the surface layer of the printed wiring board 10, that is, on the other surface of the printed wiring base 11. Vias electrically connecting the conductive layers 12, 13, 14, and 15 are formed inside the printed wiring base 11. FIG. 1C illustrates a via 16 electrically connecting the conductive layer 13 and the conductive layer 14, but vias electrically connecting the other conductive layers are also appropriately formed. The conductor of the conductive layers 12, 13, 14, and 15 and the via 16 is a material having higher conductivity and thermal conductivity than the insulator, and is, for example, a metal such as copper, gold, or the like.

The solder resist layer 17 is an insulating protective film for protecting a circuit formed by the conductive layers 12 and 15 as the wiring layers. The solder resist layer 17 is formed of a cured liquid resist, a film-like solder resist, or the like. The solder resist layer 17 is formed on the one surface and the other surface of the printed wiring base 11 so as to cover the conductive layers 12 and 15.

Openings through which the conductive layers 12 and 15 are exposed are formed in the solder resist layer 17 formed on the both surfaces of the printed wiring base 11. On the one surface of the printed wiring base 11, the exposed portion of the conductive layer 12 forms second electrodes 72 and third electrodes 73. That is, the conductive layer 12 is formed to include the second electrodes 72 and the third electrodes 73.

A plurality of the second electrodes 72 are arranged, for example, at the center of the printed wiring board 10. The plurality of second electrodes 72 form a second electrode group. The second electrode 72 is electrically connected to the first electrode 71 of the flexible printed circuit board 1 by soldering via the solder 5. In this manner, in the connected portion 6 between the flexible printed circuit board 1 and the printed wiring board 10, the first electrode group formed of the plurality of first electrodes 71 and the second electrode group formed of the plurality of second electrodes 72 are connected by soldering via the solder 5.

The third electrodes 73 are arranged around the second electrodes 72, for example. The third electrode 73 is connected to the peripheral component 40 via the solder 5.

The peripheral component 40 is an electronic component mounted on the printed wiring board 10, and is, for example, an active component such as an IC or a crystal (crystal resonator) which is relatively susceptible to heat. The peripheral component 40 may be a passive component such as a chip capacitor, a chip resistor, or the like. The peripheral component 40 includes fourth electrodes 74. The third electrodes 73 are electrically connected to the fourth electrodes 74 of the peripheral component 40 by soldering via the solder 5.

In the case where the first electrode 71 and the second electrode 72 are connected by using the solder 5, the first electrode 71 and the second electrode 72 can be bonded to the solder 5 in a state where the solder 5 is heated to a melting point or higher. The solder 5 maybe, for example, Sn-3.0Ag-0.5Cu solder or Sn-58Bi solder pasted together with flux. The same applies to the case where the fourth electrode 74 and the third electrode 73 are connected by using the solder 5.

FIG. 1B illustrates a reference region 50 relating to the connected portion 6 which is a bonded portion between the flexible printed circuit board 1 and the printed wiring board 10, and first to third regions 51, 52, and 53 in a plane including the second conductive layer 13. The reference region 50 and the first to third regions 51, 52, and 53 are regions in a plan view as viewed in the Z direction, that is, regions in a plan view with respect to a plane including the second conductive layer 13. Here, the reference region 50, the first to third regions 51, 52, 53, and the like in the second conductive layer 13 when viewed in a plan view in the Z direction will be described. The units of the lengths W1, W2, W2, L1, L2, and L3 in the following description are, for example, mm.

The reference region 50 relating to the bonded portion between the flexible printed circuit board 1 and the printed wiring board 10 is a region relating to the connected portion of the first electrodes 71 of the flexible printed circuit board 1 and the second electrodes 72 of the printed wiring board 10 by soldering via the solder 5. The reference region 50 has a contour of a rectangle, and is set such that four sides of the rectangle are circumscribed to the bonded portion between the first electrode group including the plurality of first electrodes 71 and the second electrode group including the plurality of second electrodes 72 in a plan view with respect to a plane including the second conductive layer 13. Specifically, as illustrated in FIG. 1B, the reference region 50 is a region surrounded by both left and right ends of the plurality of first electrodes 71 in the arrangement direction of the plurality of first electrodes 71 in the X direction, which is the width direction of the flexible printed circuit board 1, and both upper and lower ends in the Y direction, which is the longitudinal direction of the flexible printed circuit board 1. The reference region 50 has a planar shape of a rectangle in which the length of the long side along the X direction is W1 and the length of the short side along the Y direction is L1. Here, the X direction is a direction in which the plurality of first electrodes 71 in the flexible printed circuit board 1 are arranged. The Y direction is a direction in which the wirings of the flexible wiring layer 3 and the first electrodes 71 which are parts of the wirings in the flexible printed circuit board 1 extend.

The short side 60 of the reference region 50 is a side having a length L1 in the long side direction along the Y direction of the solder 5 bonding the first electrode 71 of the flexible printed circuit board 1 and the second electrode 72 of the printed wiring board 10. The long side 63 of the reference region 50 is a side having a length W1 from an electrode end at one end to an electrode end at the other end in the X direction in which the first electrodes 71 of the flexible printed circuit board 1 are arranged.

The first region 51 of the plane including the second conductive layer 13 of the printed wiring board 10 is a region having a shape of a rectangle and including the reference region 50, which is wider than the reference region 50. The long side of the first region 51 along the X direction has a length of W1+2×W2. The short side of the first region 51 along the Y direction has a length of L1+2×L2. Here, the length L2 is the length of the distance 61 from the boundary of the reference region 50 in the Y direction to the boundary of the first region 51 in the Y direction. The length W2 is the length of the distance 64 from the boundary of the reference region 50 in the X direction to the boundary of the first region 51 in the X direction. A region in which the reference region 50 is projected onto the second conductive layer 13 of the printed wiring board 10 in the −Z direction is included in the first region 51.

At least one of the length L2 and the length W2 is preferably 0.5 times or more the length L1, and more preferably 1 times or more the length L1. At least one of the length L2 and the length W2 is preferably 5 times or less the length L1, preferably 4 times or less the length L1, and preferably 3.5 times or less the length L1. At least one of the length L2 and the length W2 is preferably 3 times or less the length L1, preferably 2.5 times or less the length L1, and preferably 2 times or less the length L1. At least one of the length L2 and the length W2 may be 1 times or more and 3 times or less the length L1, 1 times or more and 2 times or less the length L1, or 1 times or more and 1.5 times or less the length L1. Further, the length L2 and the length W2 may be equal to each other, and when the length L2 and the length W2 are different from each other, either one of the two may be long.

The second region 52 of the plane including the second conductive layer 13 of the printed wiring board 10 is located around the outside of the first region 51 and has an annular planar shape of a rectangle that does not include the first region 51. The second region 52 is in contact with the first region 51 through a first boundary B1. The long side of the outer shape of the second region 52 along the X direction has a length of W1+2×W2+2×W3. The short side of the outer shape of the second region 52 along the Y direction has a length of L1+2×L2+2×L3. Here, the length L3 is the length of the distance 62 from the boundary in the Y direction of the first region 51 to the boundary in the Y direction of the second region 52. The length W3 is the length of the distance 65 from the boundary in the X direction of the first region 51 to the boundary in the Y direction of the second region 52. In a plan view with respect to a plane including the second conductive layer 13, that is, in a plan view as viewed in the Z direction, the second region 52 can overlap the flexible printed circuit board 1 depending on the position of the connected portion 6 in the printed wiring board 10.

At least one of the length L3 and the length W3 is preferably 0.5 times or more the length L1, preferably 1 times or more the length L1, preferably 1.5 times or more the length L1. At least one of the length L3 and the length W3 is preferably 5 times or less the length L1, preferably 4 times or less the length L1, and preferably 3.5 times or less the length L1. At least one of the length L3 and the length W3 is preferably 3 times or less the length L1, and may be 2.5 times or less the length L1. At least one of the length L3 and the length W3 is more preferably 1.5 times or more and 2.5 times or less the length L1. At least one of the length L3 and the length W3 may be 2 times or 3 times the length L1. The lengths L3 and W3 may be equal to each other, and when the lengths L2 and W2 are different, either one of the two may be longer.

A plurality of openings 20 are periodically formed in the second conductive layer 13 in the second region 52. Each opening 20 is formed so as to penetrate the second conductive layer 13 in the Z direction. The planar shape of the opening 20 as viewed in the Z direction is, for example, a circle. For example, as illustrated in FIG. 1B, the plurality of openings 20 are formed in such a manner that the positions in the Y direction are arranged in a staggered manner in three lines along the Y direction in each of the one band portion and the other band portion along the Y direction of the second region 52. Further, the plurality of openings 20 are formed in such a manner that the positions in the Y direction are arranged in a staggered manner in two lines along the X direction in each of the one band portion and the other band portion along the X direction of the second region 52.

The number of lines of the openings 20 in each band portion of the second region 52 is not limited to two or three, and may be two or more columns, or may be one. Further, the arrangement of the openings 20 does not necessarily have to be staggered, and may be periodically arranged or non-periodically arranged, and may be arranged at the same pitch or at different pitch. The planar shape of the opening 20 when viewed in the Z direction is not limited to a circle, and may be a polygon such as a rectangle, an ellipse, a shape having a concave portion or a convex portion, or the like. In addition, one or a plurality of openings 20 can be formed in the second conductive layer 13 of the second region 52 according to the required heat dissipation performance and the like, and a predetermined number of openings 20 can be formed.

The third region 53 of the plane including the second conductive layer 13 of the printed wiring board 10 is a region excluding the first region 51 and the second region 52 from the plane including the second conductive layer 13. The third region 53 is positioned around the outside of the second region 52. The third region 53 is in contact with the second region 52 through a second boundary B2.

The first boundary B1 and the second boundary B2, which are the inner and outer boundaries of the second region 52 arranged as described above, are positioned so as to satisfy the following relationship. Note that the first to fourth directions in the following description are one of the four directions of the +X direction, the −X direction, the +Y direction, and the −Y direction, and are different directions.

First, the first boundary portion, which is at least a part of the first boundary B1, is positioned within a range of 0.5 times or more and 5 times or less the length L1 of the short side 60 in the first direction from at least the first side, which is one side of the four sides of the reference region 50, toward the outside of the reference region 50. Preferably, the first boundary portion is positioned within a range of 1 times or more and 2 times or less the length L1 of the short side 60 in the first direction from at least the first side, which is one of the four sides of the reference region 50, toward the outside of the reference region 50. The second boundary portion, which is at least a part of the second boundary B2, is positioned within a range of 0.5 times or more and 5 times or less the length L1 of the short side 60 in the first direction from the first boundary portion of the first boundary B1. Preferably, the second boundary portion is positioned within a range of 1.5 times or more and 2.5 times or less the length L1 of the short side 60 in the first direction from the first boundary portion of the first boundary B1.

The third boundary portion, which is at least a part of the first boundary B1, is positioned within a range of 0.5 times or more and 5 times or less the length L1 of the short side 60 in the second direction from at least the second side, which is one side of the four sides of the reference region 50, toward the outside of the reference region 50. Preferably, the third boundary portion is positioned within a range of 1 times or more and 2 times or less the length L1 of the short side 60 in the second direction from at least the second side, which is one side of the four sides of the reference region 50, toward the outside of the reference region 50. The fourth boundary portion, which is at least a part of the second boundary B2, is positioned within a range of 0.5 times or more and 5 times or less the length L1 of the short side 60 in the second direction from the third boundary portion of the first boundary B1. Preferably, the fourth boundary portion is positioned within a range of 1.5 times or more and 2.5 times or less the length L1 of the short side 60 in the second direction from the third boundary portion of the first boundary B1.

The fifth boundary portion, which is at least a part of the first boundary B1, is positioned within a range of 0.5 times or more and 5 times or less the length L1 of the short side 60 in the third direction from at least the third side, which is one side of the four sides of the reference region 50, toward the outside of the reference region 50. Preferably, the fifth boundary portion is positioned within a range of 1 times or more and 2 times or less the length L1 of the short side 60 in the third direction from the at least third side, which is one of the four sides of the reference region 50, toward the outside of the reference region 50. The sixth boundary portion, which is at least a part of the second boundary B2, is positioned within a range of 0.5 times or more and 5 times or less the length L1 of the short side 60 in the third direction from the fifth boundary portion of the first boundary B1. Preferably, the sixth boundary portion is positioned within a range of 1.5 times or more and 2.5 times or less the length L1 of the short side 60 in the third direction from the fifth boundary portion of the first boundary B1.

The seventh boundary portion, which is at least a part of the first boundary B1, is positioned within a range of 0.5 times or more and 5 times or less the length L1 of the short side 60 in the fourth direction from at least the fourth side, which is one side of the four sides of the reference region 50, toward the outside of the reference region 50. Preferably, the seventh boundary portion is positioned within a range of 1 times or more and 2 times or less the length L1 of the short side 60 in the fourth direction from at least the fourth side, which is one of the four sides of the reference region 50, toward the outside of the reference region 50. The eighth boundary portion, which is at least a part of the second boundary B2, is positioned within a range of 0.5 times or more and 5 times or less of the length L1 of the short side 60 in the fourth direction from the seventh boundary portion of the first boundary B1. Preferably, the eighth boundary portion is positioned within a range of 1.5 times to 2.5 times the length L1 of the short side 60 in the fourth direction from the seventh boundary portion of the first boundary B1.

The above relationship may be satisfied for at least one of the first to fourth sides which are the four sides of the reference region 50. In addition, it is preferable that one side of the four sides of the reference region 50 that satisfy the above relationship is the long side of the four sides. The four sides of the reference region 50 include two pairs of opposite sides.

The density of the second conductive layer 13 in the first region 51 is higher than the density of the second conductive layer 13 in the second region 52. The first region 51 has a relatively high density of the second conductive layer 13 and has, in addition to the region in which the reference region 50 is projected onto the second conductive layer 13, around the region, an annular region of the rectangle, in which the width in the X direction is W2 and the width in the Y direction is L2. Therefore, in the first region 51, the heat from the connected portion 6 due to the solder 5 between the flexible printed circuit board 1 and the printed wiring board 10 can be diffused in the planar direction, and the heat dissipation property can be improved.

From the viewpoint of further improving the heat dissipation property, it is preferable that the density of the second conductive layer 13 in the region excluding the reference region 50 from the first region 51 in the plan view when viewed in the Z direction is higher than the density of the second conductive layer 13 in the reference region 50. Here, the plan view when viewed in the Z direction is the plan view with respect to the plane including the second conductive layer 13. By having such a density difference in the second conductive layer 13, heat dissipation from the second conductive layer 13 can be promoted and the heat dissipation property can be further improved. In addition, the second conductive layer 13 in the region excluding the region overlapping with the reference region 50 from the first region 51 is preferably a solid pattern. This pattern can also further improve heat dissipation.

Further, from the viewpoint of ensuring heat dissipation, the density of the second conductive layer 13 in the first region 51 is preferably 50% or more in area ratio.

On the other hand, in the second region 52 arranged around the first region 51, the density of the second conductive layer 13 is lower than that of the first region 51. Therefore, in the second region 52, it is possible to suppress transfer of heat from the connected portion 6 which is a bonded portion between the flexible printed circuit board 1 and the printed wiring board 10 by the solder 5 to the outside of the second region 52 in the inner layer of the printed wiring board 10 to a low level. Further, since the plurality of openings 20 are formed in the second region 52, heat transfer can be effectively suppressed to a low level. In this way, the second region 52 can suppress the influence of heat of the solder 5 between the flexible printed circuit board 1 and the printed wiring board 10 on the periphery of the connected portion 6 in the inner layer of the printed wiring board 10. This makes it possible to suppress the influence of heat on the peripheral components 40 mounted on the printed wiring board 10, in particular, the influence of heat on the peripheral component 40, which is an active component adversely affected by heat.

In the present embodiment, the case where the reference region 50 is positioned at the center of the first region 51 in the plan view viewed in the Z direction has been described, but the relationship between the first region 51 and the reference region 50 is not limited thereto. The first region 51 may include the reference region 50 in the plan view as viewed in the Z direction, and may be a region positioned to the outside of the reference region 50 in at least one direction. In this case, the reference region 50 may be located not only at the center of the first region 51 as in the present embodiment but also inside the first region 51. The planar shape of the first region 51 is not limited to the rectangle, and may be a polygon other than a rectangle, a shape including a curve such as a circle or an ellipse, or a shape including concave and convex. In this case, the first region 51 may be a region having the length that is 1 times or more and 2 times or less the length L1 of the short side 60 of the reference region 50 outside the reference region 50 in the Y direction, which is the direction along the short side 60 of the reference region 50, in the plan view as viewed in the Z direction.

Further, in the present embodiment, the case where the second region 52 is positioned around the first in the plan view viewed in the Z direction has been described, but the relationship between the first region 51 and the second region 52 is not limited thereto. The second region 52 may be a region located outside the first region 51 in the plan view as viewed in the Z direction. Further, the planar shape of the second region 52 is not limited to an annular shape of the rectangle, and may be an annular shape having an outer shape of a polygon other than a rectangle, a shape including a curved line such as, a circle, an ellipse, or the like, or a shape including concave and convex, or the like, or a shape in which a part of the annular shape is missing. In this case, the second region 52 may be a region having a length that is 1.5 times or more and 2.5 times or less the length L1 of the short side 60 of the reference region 50 outside the first region 51 in the X direction which is the direction along the short side 60 of the reference region 50 in the plan view as viewed in the Z direction.

The peripheral component 40 includes fourth electrodes 74. The fourth electrodes 74 of the peripheral component 40 are electrically connected to the third electrodes 73 of the printed wiring board 10 by soldering via the solder 5.

The arrangements of the peripheral components 40 will now be described with reference to FIG. 1A. FIG. 1A illustrates a boundary line 80 in which the boundary of the first region 51 is projected in the +Z direction onto the upper surface of the printed wiring board 10, and a boundary line 81 in which the boundary of the second region 52 is projected in the +Z direction onto the upper surface of the printed wiring board 10.

The peripheral component 40, which is an active component, is preferably arranged at a position outside the boundary line 81 from the viewpoint of suppressing the above-described influence of heat. That is, the peripheral component 40, which is the active component, is preferably arranged on the third region 53.

On the other hand, when the peripheral component 40 is a passive component such as a chip capacitor, a chip resistor, or the like, the passive component may have a higher heat resistance than the peripheral component 40, such as the active component which may be arranged on the third region 53. If the peripheral component 40 has a higher heat resistance than the peripheral component 40 that may be arranged on the third region 53, such as the passive component, the peripheral component 40 may be arranged at a position outside the boundary line 80 and inside the boundary line 81. That is, the peripheral component 40 having higher heat resistance than the peripheral component 40 which may be arranged on the third region 53 may be arranged on the second region 52.

The peripheral components 40 are not limited to be arranged in the above-described arrangement, and may be arranged at appropriate positions according to the design of the electronic module 100 or the like and mounted on the printed wiring board 10.

Although not illustrated, the minimum component necessary for the operation of the electronic module 100 are mounted on the printed wiring board 10. The flexible base 2 maybe covered with, for example, an ultraviolet (UV) curing resin, a thermosetting resin, a film-like reinforcing part, or the like only at both ends in the X direction, which is the width direction, or over the X direction, which is the width direction. Thereby, the structure of the connected portion 6 by the solder 5 and the reinforcing material improve the connection strength.

Although FIGS. 1A to 1C illustrate a case where the flexible printed circuit board 1 is connected to the printed wiring board 10 such that the longitudinal direction of the flexible printed circuit board 1 is parallel to the short side of the printed wiring board 10, the present invention is not limited thereto. The flexible printed circuit board 1 maybe connected to the printed wiring board 10 such that the longitudinal direction of the flexible printed circuit board 1 is parallel to the long side of the printed wiring board 10.

Although FIGS. 1A to 1C illustrate a case where one flexible printed circuit board 1 is connected to the printed wiring board 10, the present invention is not limited thereto. The plurality of flexible printed circuit boards 1 maybe connected to the printed wiring board 10. When the plurality of flexible printed circuit boards 1 are connected to the printed wiring board 10, the directions in which the plurality of flexible printed circuit boards 1 are leaded out may be the same direction or different directions.

Second Embodiment

Figure 2:
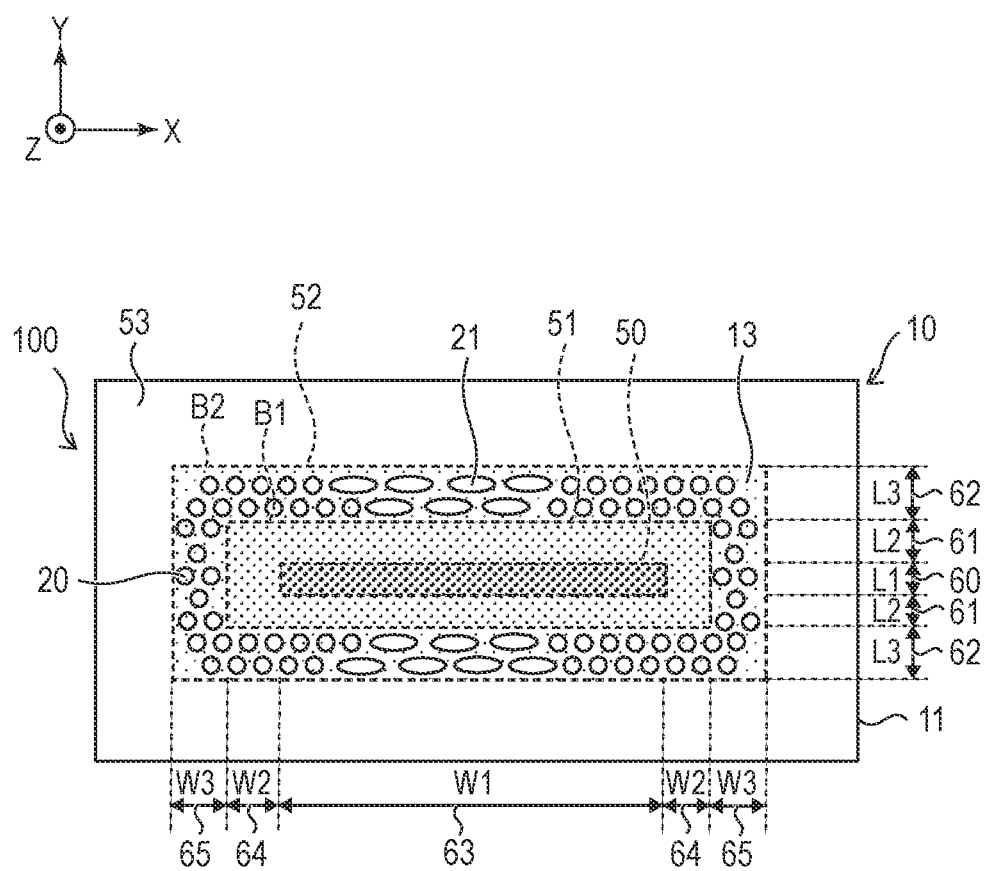
FIG. 2 is a schematic diagram illustrating an electronic module according to a second embodiment.

Next, an electronic module according to a second embodiment will be described with reference to FIG. 2. FIG. 2 is the plan view illustrating the second conductive layer 13 of the second layer from the surface layer when the electronic module 100 according to the present embodiment is viewed from the top.

In this embodiment, the shape of the opening 20 in the second region 52 is different. That is, in the present embodiment, as illustrated in FIG. 2, the second conductive layer 13 in the second region 52 is formed with a plurality of openings 21 instead of a part of the plurality of openings 20. Each opening 21 is formed so as to penetrate the second conductive layer 13 in the Z direction. The opening 21 has an elliptical planar shape as the planar shape when viewed in the Z direction, and has a larger opening area than the opening 20. The plurality of openings 21 are formed at the centers of one and the other of the band portions along the X direction of the second region 52 positioned along the long side of the first region 51. That is, the opening 21 is formed at a position closer to the center of the long side 63 than the end of the long side 63 of the reference region 50. The central portion of the long side 63 means two middle portions of the long side 63 divided into four equal portions, and the peripheral portion of the long side 63 means 25% of each of both end portions (left and right) of the long side 63. Thus, in the present embodiment, the opening 21 serving as a first opening and the opening 20 serving as a second opening whose opening area is smaller than that of the opening 21 are formed in the second conductive layer 13 in the second region 52. The other configurations are the same as those of the first embodiment.

As described above, in the present embodiment, the opening 21 formed in the central portion of the band portion along the X direction of the second region 52 positioned along the long side of the first region 51 has the elliptic planar shape, and has the larger opening area than the peripheral opening 20. Thus, the opening area of the opening 21 adjacent to the center of the reference region 50 is larger than those of the other openings 20. As in the case of the flexible printed circuit board 1, a rectangular connected portion is formed as the connected portion 6 with the printed wiring board 10, and when the connected portion 6 generates heat, the heat generation portions thermally interfere with each other, and as a result, the temperature of the rectangular center portion becomes higher than that of the surroundings. Therefore, in the case where all the openings 20 arranged in the second region 52 have the same shape, it may be difficult to suppress the influence of heat caused by the heat in the central portion to be small. On the other hand, in the present embodiment, since the opening area of the central portion of the second region 52 is selectively increased by the elliptical opening 21, even when the central portion of the connected portion 6 generates more heat, it is possible to suppress the influence of heat on the surroundings to be small.

The planar shape of the opening 21 when viewed in the Z direction is not limited to shape of ellipse, and may be a polygon such as a rectangle, a shape of circle, a shape having a concave portion or a convex portion, or the like. In addition, one or the plurality of openings 21 can be formed in the second conductive layer 13 of the second region 52 according to the required heat dissipation performance and the like, and a predetermined number of openings 21 can be formed. The opening 20 maybe formed such that the second conductive layer 13 is continuous from the opening 20 to the first region 51. Also, the opening 21 can be formed so that the second conductive layer 13 is continuous from the opening 21 to the first region 51.

Third Embodiment

Figure 3:
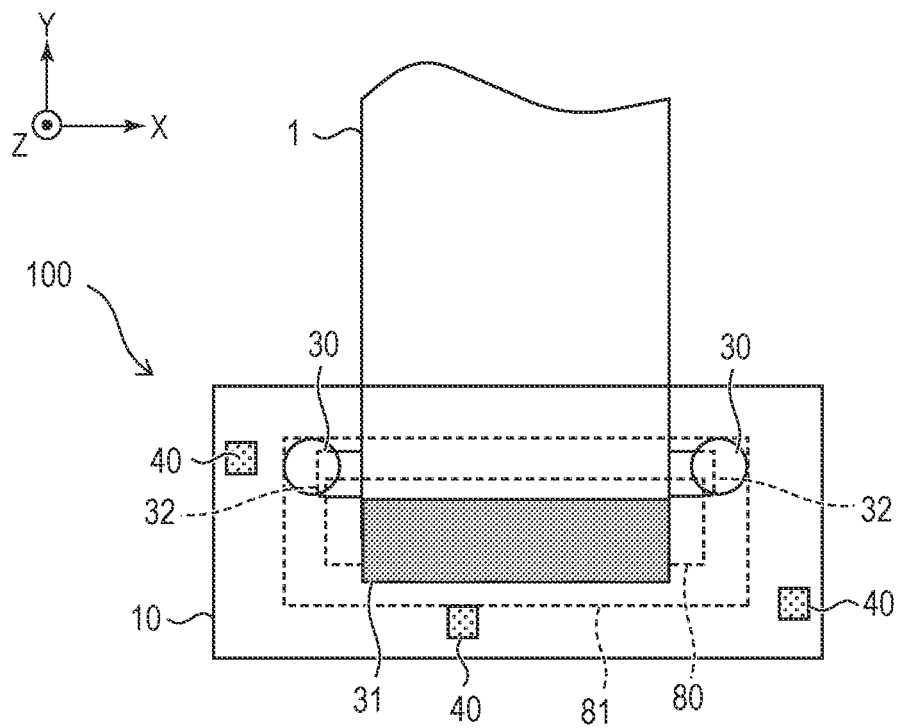
FIG. 3 is a schematic diagram illustrating an electronic module according to a third embodiment.

Next, an electronic module 100 according to a third embodiment will be described with reference to FIG. 3. FIG. 3 is the top plan view of the electronic module 100 according to the present embodiment.

In the present embodiment, as illustrated in FIG. 3, a heat dissipation part 31 as the heat dissipation part is arranged at a connected portion 6 between the flexible printed circuit board 1 and the printed wiring board 10. The heat dissipation part 31 is formed on the upper surface of the printed wiring board 10 so as to cover the connected portion 6 which is a bonded portion between the flexible printed circuit board 1 and the printed wiring board 10. The flexible printed circuit board 1 is provided between the heat dissipation part 31 and the printed wiring board 10 so that heat from the connected portion 6 is transferred to the heat dissipation part 31 through the flexible printed circuit board 1. Further, in the present embodiment, the flexible printed circuit board 1 has protruding portions 32. The protruding portions 32 protrude outward in the X direction from both side portions of the flexible printed circuit board 1 along the Y direction. The protruding portion 32 is positioned on the printed wiring board 10. The protruding portion 32 is reinforced by the reinforcing part 30 and fixed to the printed wiring board 10. The other configurations are the same as those of the first embodiment.

As described above, in the present embodiment, the heat dissipation part 31 is arranged so as to cover the connected portion 6 between the flexible printed circuit board 1 and the printed wiring board 10. Although the material of the heat dissipation part 31 is not particularly limited, the heat dissipation part 31 is made of a material having excellent thermal conductivity, such as a metal, ceramics, a carbon member such as a graphite sheet, or the like. Although the shape of the heat dissipation part 31 is not particularly limited, the heat dissipation part 31 has, for example, the shape of a rectangle having the long side along the X direction and the short side along the Y direction.

It is preferable that the heat dissipation part 31 is arranged such that the short side thereof straddles the boundary line 80 and is positioned inside the boundary line 81. As described above, the boundary line 80 is a line in which the boundary of the first region 51 is projected onto the upper surface of the printed wiring board 10 in the +Z direction, and the boundary line 81 is a line in which the boundary of the second region 52 is projected onto the upper surface of the printed wiring board 10 in the +Z direction. By arranging the heat dissipation part 31 in this manner, the heat of the connected portion 6 of the flexible printed circuit board 1 can be dissipated more efficiently. Further, since the heat dissipation part 31 is arranged inside the boundary line 81, heat conducted to the second region 52 of the printed wiring board can also be absorbed by the heat dissipation part 31, so that the influence of heat on the peripheral component 40, which is an active component, can be suppressed to a small extent.

In addition, the protruding portions 32 formed along the X direction, which is the width direction of the flexible printed circuit board 1, are fixed to the printed wiring board 10 by the reinforcing parts 30. The reinforcing part 30 is made of, for example, a resin such as an ultraviolet curing resin. Similarly to the heat dissipation part 31, since the reinforcing part 30 absorbs heat, it is possible to suppress the influence of heat on the peripheral component 40. Further, in addition to the reduction of the influence of heat by the reinforcing part 30, the strength of the connected portion 6 between the flexible printed circuit board 1 and the printed wiring board 10 can be improved by the reinforcing parts 30.

In the present embodiment, the electronic module 100 is configured to include the reinforcing parts 30, the heat dissipation part 31, and the protruding portions 32 in addition to the configuration of the first embodiment. In addition to the configuration of the second embodiment, the electronic module 100 may be configured to include the reinforcing parts 30, the heat dissipation part 31, and the protruding portions 32 as in the present embodiment.

Fourth Embodiment

Figure 4A:
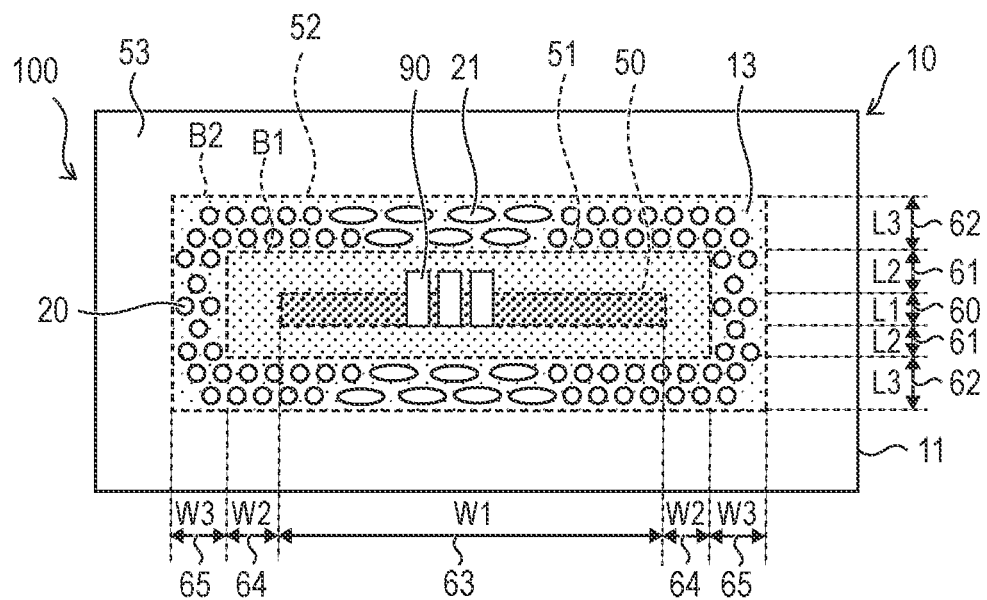
FIG. 4A, FIG. 4B, and FIG. 4C are a schematic diagram illustrating an electronic module according to a fourth embodiment.
Figure 4B:
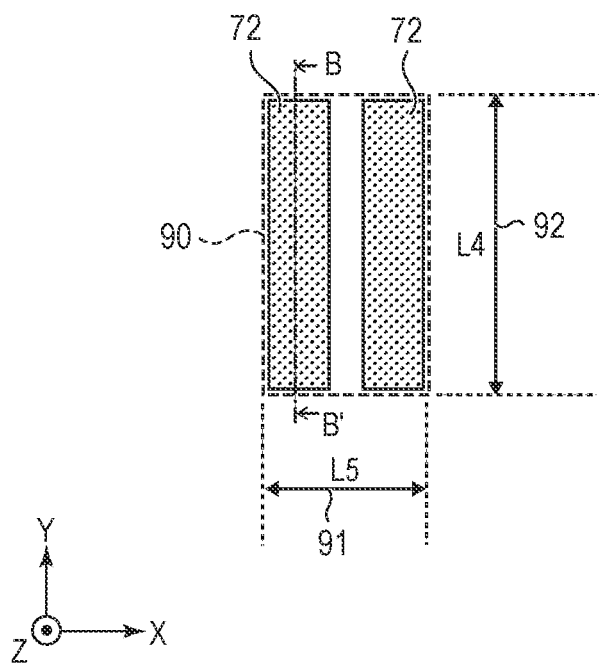
Figure 4C:
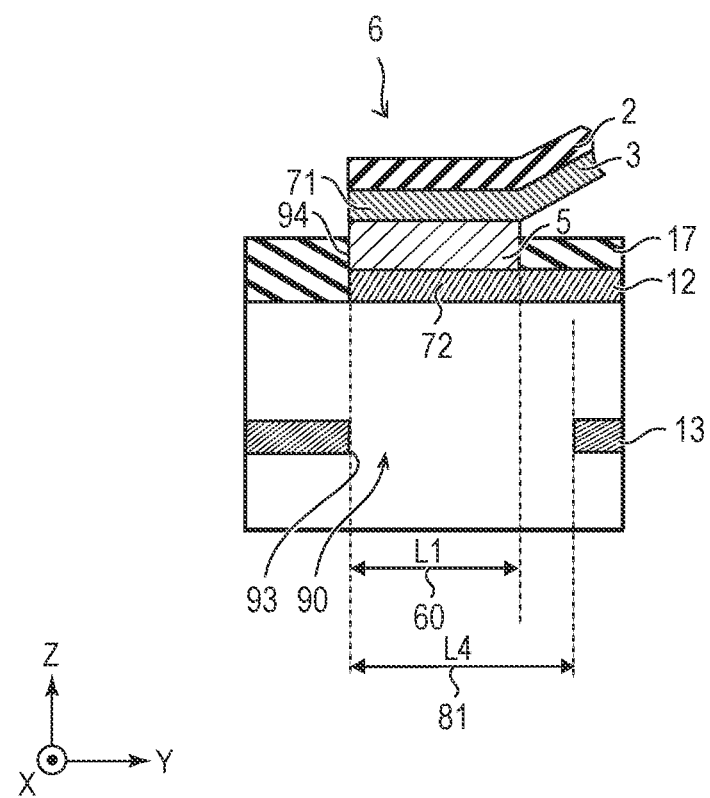

Next, an electronic module 100 according to a fourth embodiment will be described with reference to FIGS. 4A to 4C. FIG. 4A is the plan view illustrating the second conductive layer 13 of the second layer from the surface layer when the electronic module 100 according to the present embodiment is viewed from the top. FIG. 4B is an enlarged plan view of an opening 90 formed in the first region 51. FIG. 4C is a cross-sectional view taken along the line B-B' in FIG. 4B.

In the present embodiment, as illustrated in FIG. 4A, in addition to the configuration of the second embodiment, rectangular openings 90 are formed as third openings in the second conductive layer 13 in the first region 51. Other configurations are similar to those of the second embodiment. In the present embodiment, since the rectangular openings 90 are formed in the second conductive layer 13 of the first region 51, heat conduction in the surface direction can be suppressed while heat dissipation in the first region 51 is maintained.

In FIG. 4B, one of the rectangular openings 90 formed in the second conductive layer 13 in the first region 51 is enlarged, and the second electrode 72 in the conductive layer 12 which is the first conductive layer of the printed wiring board 10 is illustrated superimposed in the thickness direction of the printed wiring board 10 which is the −Z direction. The rectangular opening 90 has a planar shape of a rectangle having a short side 91 of a length L5 along the X direction and a long side 92 of a length L4 along the Y direction. The rectangular opening 90 includes, for example, two rectangular terminals of the second electrodes 72 of the printed wiring board 10 in the X direction, which is the arrangement direction of the rectangular terminals in the short side 91. That is, the rectangular opening 90 is formed so as to overlap with, for example, the second electrodes 72 of two terminals in a plan view when viewed in the Z direction. Note that the number of terminals of the second electrodes 72 where the rectangular opening 90 overlaps is not limited to two, and may be one terminal, or may be three or more terminals.

FIG. 4C is a cross-sectional view taken along the line B-B' in FIG. 4B. The rectangular opening 90 extends through the second conductive layer 13 in the Z direction. One end 93 of the long side 92 of the rectangular opening 90 of the first region 51 coincides with one end 94 of the long side of the bonded portion formed by the solder 5. That is, the second electrode 72 and the rectangular opening 90 overlap each other in the plan view as viewed in the Z direction, which is the thickness direction of the printed wiring board 10.

Further, each terminal of the second electrode 72 and the first electrode 71 connected to the second electrode 72 located above the rectangular opening 90 may be a signal terminal through which a signal is transmitted. In the case of the signal terminal, the impedance characteristic can be improved by the opening 90, and the high-speed signal can be supported. As described above, in the present embodiment, it is possible to achieve both the improvement of the signal characteristics and the improvement of the heat dissipation characteristics. From the viewpoint of achieving both of these points, the length L5 of the short side 91 of the rectangular opening 90 is preferably 1 times or more and 3 times or less the length of the short side of the second electrode 72 and the first electrode 71 connected to the second electrode 72 in the X direction, which is the direction along the short side 91. From the same viewpoint, the length L4 of the long side 92 of the rectangular opening 90 is more preferably 1 times or more and 2 times or less the length of the long side that is the long side of the second electrode 72 and the first electrode 71 connected to the second electrode 72 in the Y direction that is the direction along the long side 92. The opening 90 need not necessarily have a planar shape of the rectangle, and may have a planar shape having a short side and a long side. In this case, the length of the short side of the opening 90 corresponding to the short side 91 is preferably 1 times or more and 3 times or less the length of the short side of the second electrode 72 and the first electrode 71 connected to the second electrode 72 in the direction along the short side. The length of the opening 90 in the longitudinal direction corresponding to the long side 92 is more preferably 1 times or more and 2 times or less the length of the second electrode 72 and the first electrode 71 connected to the second electrode 72 in the longitudinal direction.

In the present embodiment, in addition to the configuration of the second embodiment, the case where the opening 90 are formed in the first region 51 has been described, but the present invention is not limited thereto. In addition to the configuration of the first or third embodiment, the openings 90 may be formed in the first region 51 as in the present embodiment.

Fifth Embodiment

Figure 5A:
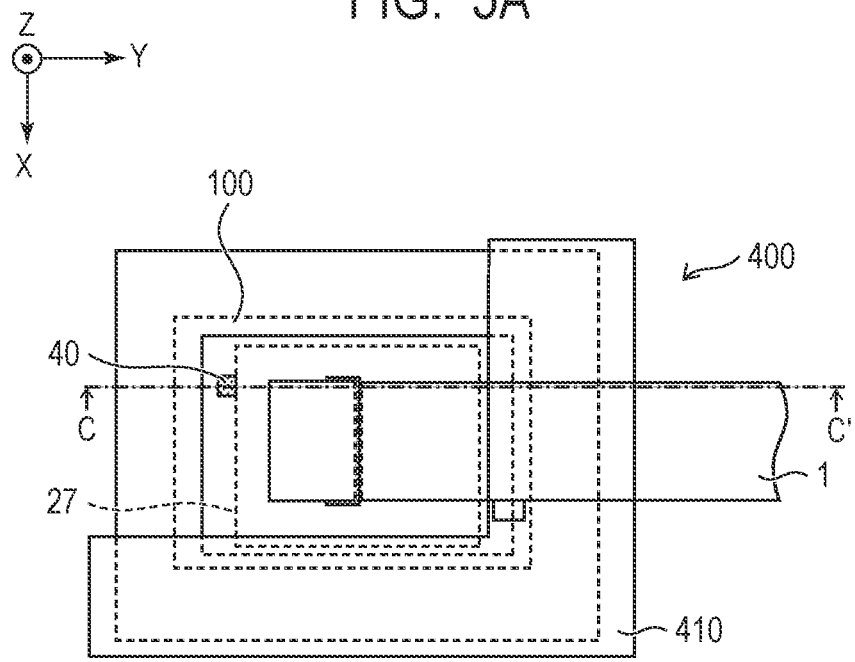
FIG. 5A and FIG. 5B are a schematic diagram illustrating an imaging unit according to a fifth embodiment.
Figure 5B:
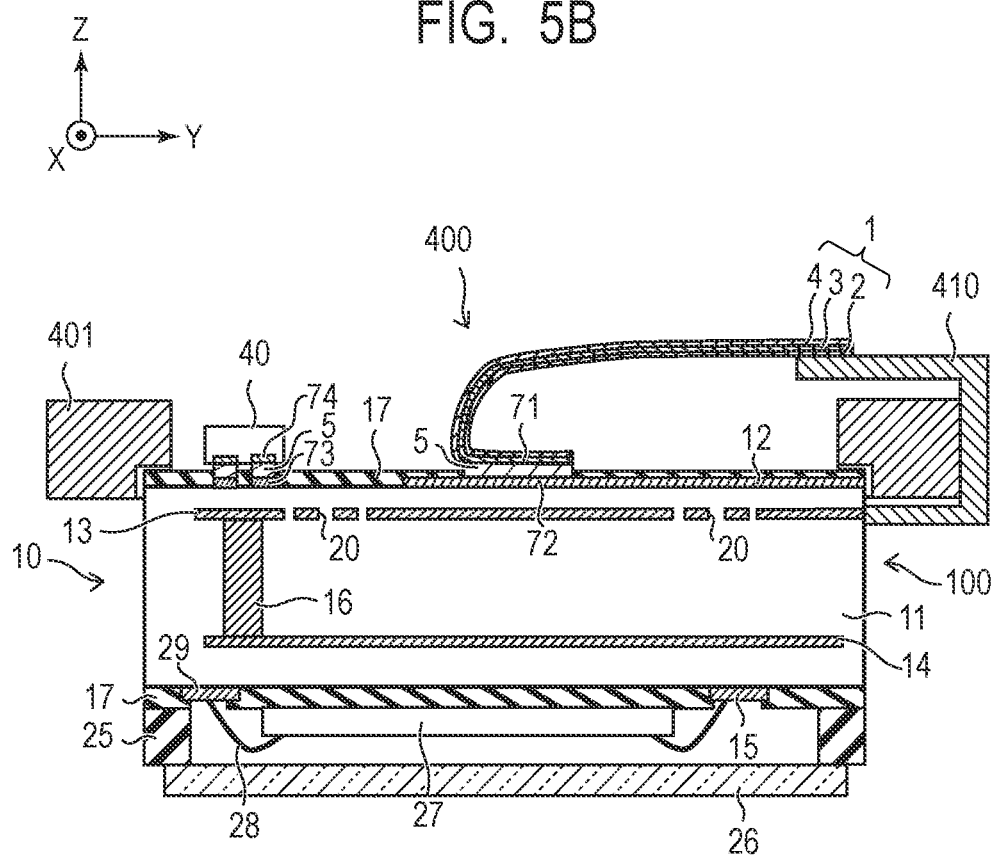

Next, an imaging unit 400 according to a fifth embodiment will be described with reference to FIGS. 5A and 5B. FIG. 5A is a schematic top view illustrating a schematic configuration of the imaging unit 400 according to the present embodiment. FIG. 5B is a schematic cross-sectional view illustrating a schematic configuration of the imaging unit 400 according to the present embodiment, and illustrates a cross-sectional view taken along a line C-C' in FIG. 5A. In the present embodiment, an imaging unit 400 configured using the electronic module 100 according to any one of the first to fourth embodiments will be described.

As illustrated in FIGS. 5A and 5B, the imaging unit 400 includes the electronic module 100 according to any one of the first to fourth embodiments, an imaging element 27, a frame 25, and a cover glass 26. The electronic module 100 includes the printed wiring board 10 and the flexible printed circuit board 1.

The frame 25 is adhered and fixed by an adhesive such as an ultraviolet curing resin to a peripheral end portion of a surface of the printed wiring board 10 opposite to a surface to which the flexible printed circuit board 1 is connected. The cover glass 26 is attached to the frame 25 so as to face the printed wiring board 10. The imaging element 27 is mounted on a surface surrounded by the frame 25 and the cover glass 26 of the printed wiring board 10. The surface of the printed wiring board 10 on which the imaging element 27 is mounted is not necessarily the surface opposite to the surface to which the flexible printed circuit board 1 is connected, and may be the surface to which the flexible printed circuit board 1 is connected.

The imaging unit 400 is held by the camera shake correction unit 410 so as to be movable with respect to the camera shake correction unit 410. Although not illustrated, the imaging unit 400 is connected to a connector mounted on the printed wiring board of an image processing unit via the other inserting terminal of the flexible printed circuit board 1 or a connector component mounted on the flexible printed circuit board 1. In this way, the flexible printed circuit board 1 electrically connects the imaging unit 400 and the image processing unit to each other.

The imaging element 27 is a solid-state imaging element such as a CMOS (Complementary Metal Oxide Semiconductor) image sensor, a CCD (Charge Coupled Device) image sensor, or the like. The imaging element 27 is attached to the printed wiring board 10 so as not to contact the cover glass 26 in a hollow portion surrounded by the printed wiring board 10, the cover glass 26, and the frame 25. The frame 25 maybe a metal frame or a resin frame. The imaging element 27 is electrically connected to wire pads 29 of the printed wiring board 10 through metal wires 28. The wire pad 29 is, for example, gold-plated. For example, the imaging element 27 of an LGA (Land Grid Array) type or a CLCC (Ceramic Leadless Chip Carrier) type can be used.

The imaging unit 400 is attached to and fixed to a frame 401 which is, for example, a metal frame. The frame 401 is fixed to the peripheral portion of the surface of the printed wiring board 10 to which the flexible printed circuit board 1 is connected in the imaging unit 400. The camera shake correction unit 410 supports the frame 401 so that the imaging unit 400 fixed to the frame 401 can be moved in the X direction and the Y direction and can be rotated in a rotation direction around a rotation axis along the Z axis. The camera shake correction unit 410 can correct the camera shake by moving or rotating the imaging unit 400 in accordance with the camera shake.

In the present embodiment, the case where the frame 25 is attached is described, but the position where the frame 25 is arranged is not limited to the peripheral portion of the printed wiring board 10. The printed wiring board 10 maybe embedded in the cavity-shaped frame 25. The imaging element 27 maybe arranged in a hollow portion of the printed wiring board 10 having a counterbore, such as a cavity substrate.

Sixth Embodiment

Figure 6:
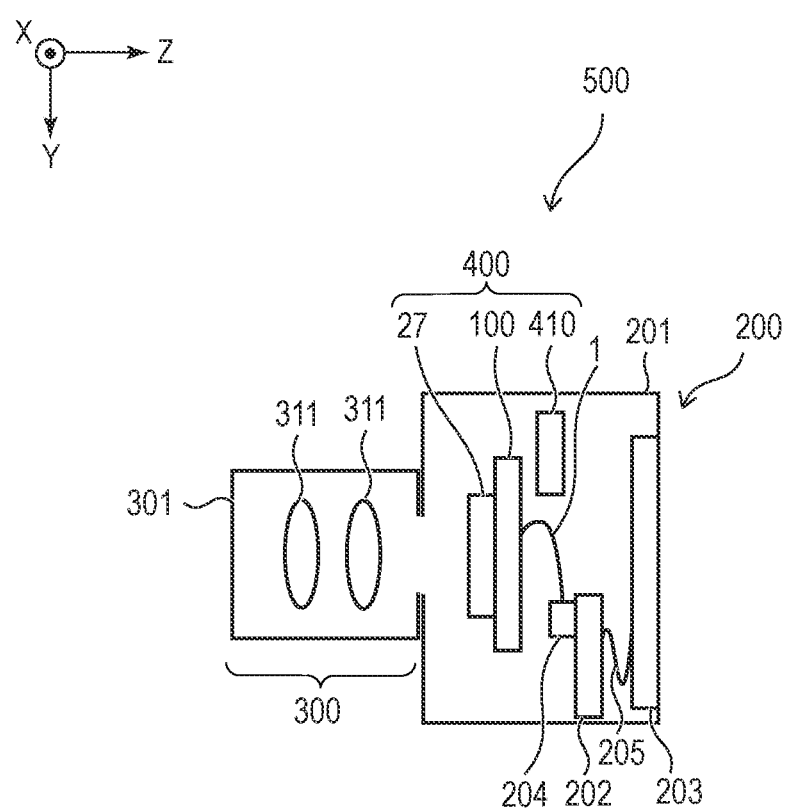
FIG. 6 is a schematic diagram illustrating electronic equipment according to a sixth embodiment.

Next, electronic equipment according to a sixth embodiment will be described with reference to FIG. 6. FIG. 6 is a schematic diagram illustrating a schematic configuration of an imaging apparatus as an example of the electronic equipment according to the present embodiment.

A digital camera 500 as an imaging apparatus of an example of the electronic equipment according to the present embodiment is, for example, a digital single lens reflex camera, a digital mirrorless camera, or the like. As illustrated in FIG. 6, the digital camera 500 includes a camera body 200 and an interchangeable lens 300 that can be attached to and detached from the camera body 200. In FIG. 6, the interchangeable lens 300 is mounted on the camera body 200. Hereinafter, a case where the interchangeable lens 300 is mounted on the camera body 200 to configure the digital camera 500 as an imaging apparatus will be described.

The camera body 200 includes a housing 201, an imaging unit 400, and a circuit board 202. The imaging unit 400 and the circuit board 202 are arranged inside the housing 201. The camera body 200 may include a mirror, a shutter, and the like. The circuit board 202 is, for example, a printed wiring board and includes an image processing circuit. The camera body 200 includes a display device 203 fixed to the housing 201 so as to be exposed to the outside from the housing 201. The display device 203 may be a liquid crystal display, for example.

The interchangeable lens 300 includes a housing 301, which is an interchangeable lens housing, and an imaging optical system 311. The imaging optical system 311 includes a plurality of lenses. The housing 301 of the interchangeable lens 300 includes a lens-side mount having an opening. On the other hand, the housing 201 of the camera body 200 includes a camera-side mount having an opening. By fitting the lens-side mount and the camera-side mount together, the interchangeable lens 300 (housing 301) is attached to the camera body 200 (housing 201).

The imaging optical system 311 is arranged inside the housing 301, and forms an optical image on the imaging element 27 mounted on the electronic module 100 when the housing 301 is mounted on the housing 201. The electronic module 100 is attached to the camera shake correction unit 410, and forms the imaging unit 400. The camera shake correction unit 410 functions as a driving unit that moves the printed wiring board 10 of the electronic module 100 inside the housing 201 to correct camera shake. The other of the flexible printed circuit boards 1 connected to the imaging unit 400 is connected to a connector 204 mounted on another circuit board 202. The circuit board 202 is connected to the display device 203 through another flexible printed circuit board 205.

The imaging element 27 in the imaging unit 400 is an imaging element such as a CMOS image sensor, a CCD image sensor, or the like that photoelectrically converts an optical image provided by the imaging optical system 311.

According to the present embodiment, also in the digital camera 500, it is possible to improve the heat dissipation characteristic for dissipation of heat generated in the connected portion 6 between the flexible printed circuit board 1 and the printed wiring board 10, and suppress the influence of heat on the peripheral components 40. Thus, the performance of the digital camera 500 can be improved.

In the present embodiment, the interchangeable lens 300 is attached to the camera body 200, but the present invention is not limited thereto. When the interchangeable lens 300 is only the camera body 200 which is not mounted, the camera body 200 is an imaging apparatus. In the present embodiment, the digital camera 500 is divided into the camera body 200 and the interchangeable lens 300, but the present invention is not limited thereto. The digital camera 500 may be an integrated camera in which a lens is incorporated in the camera body 200. Further, in the present embodiment, the digital camera 500 as an imaging apparatus of the electronic equipment has been described, but the present invention is not limited thereto. The electronic equipment may be any type of equipment that may include the electronic module 100.

Example 1

As an imaging unit of Example 1, the imaging unit 400, in which the printed wiring board 10 has the configuration illustrated in FIGS. 4A to 4C in the configuration of the imaging unit 400 according to the fifth embodiment illustrated in FIGS. 5A and 5B, the printed wiring board 10, was manufactured.

In the imaging unit 400 of the first embodiment, the frame 25 was made of resin and has a thickness of 2 mm. As the imaging element 27, a CMOS image sensor having a planar shape of the rectangle of 30 mm×20 mm was used. The cover glass 26 had a planar shape of the rectangle of 28 mm×38 mm.

As the flexible printed circuit board 1, the flexible base 2 and the coverlay 4 were made of polyimide, and the flexible wiring layer 3 and the first electrode 71 were made of Cu. The thickness of each of the flexible base 2 and the coverlay 4 was 12.5 µm, the thickness of the flexible wiring layer 3 was 12 µm, and the width of the flexible printed circuit board 1 was 17 mm.

As the printed wiring board 10, a printed wiring board in which the material of the printed wiring base 11 was a glass epoxy material and the materials of the conductive layers 12, 13, 14, and 15 and the second electrode 72 were each Cu was used. The thickness of each of the conductive layers 12, 13, 14, and 15 and the second electrode 72 was about 30 µm, the solder resist layer 17 was a film resist, and the thickness of the solder resist layer 17 was 20 µm. As an adhesive for fixing the printed wiring board 10 to the frame 401, which was a metal frame, a UV curing resin was used. As the frame 401, a frame having an outer shape of 50 mm×60 mm was used.

The first electrodes 71 of the flexible printed circuit board 1 and the second electrodes 72 of the printed wiring board 10 were connected by the solder 5. The pitch of the second electrodes 72 was 0.2 mm, the electrode width was 0.1 mm, and the number of electrodes were 80. The opening of the solder resist layer 17 where the second electrode 72 was exposed was set to have a size of 1.0 mm×20 mm. On the other hand, the pitch of the first electrodes 71 was 0.2 mm, the electrode width was 0.1 mm, and the number of electrodes were 80. The pitch of the electrodes, the electrode width, and the number of the electrodes were appropriately set in accordance with the specifications of the imaging unit 400.

The short side of the reference region 50 between the flexible printed circuit board 1 and the printed wiring board 10 was 1 mm, and the long side thereof was 16 mm. The first region 51 was a region of a rectangle having a short side length L1 of 3 mm and a long side length W1 of 20 mm. The second region 52 was a region excluding the first region 51 from a region of a rectangle having a short side of 6 mm and a long side of 26 mm.

The circular openings 20 of the second region 52 were arranged periodically in a staggered manner. Specifically, a line of similar opening groups adjacent in the Y direction to a line of opening groups including a plurality of openings 20 arranged in the X direction was shifted by +0.3 mm in the X direction, and this was periodically repeated. The planar shape of the opening 20 was circular with a diameter of 0.3 mm. The pitch of the openings 20 in the X direction was 0.6 mm, and the pitch of the openings 20 in the Y direction was 0.3 mm.

The elliptical openings 21 of the second region 52 were periodically arranged in a staggered manner. Specifically, a line of similar opening groups adjacent in the +Y direction to a line of opening groups including a plurality of openings 21 arranged in the X direction was shifted by +1 mm in the X direction, and this was periodically repeated. The planar shape of the opening 21 was an elliptical shape having a short axis of 0.5 mm and a long axis of 1.0 mm. The pitch of the openings 21 in the X direction was 2.0 mm, and the pitch of the openings 21 in the Y direction was 1.0 mm.

The rectangular opening 90 formed in the first region 51 had a short side length L5 of 0.3 mm and a long side length L4 of 1.5 mm. One of the short sides of the opening 90 was in contact with the boundary line of the reference region 50. The distance between the openings 90 adjacent to each other in the X direction was 0.3 mm. Three openings 90 were arranged.

As the peripheral component 40, an IC of 4 mm square, which is an active component, was used. The solder 5 made of Sn-3.0Ag-0.5Cu was used. As the camera shake correction unit 410, a unit having an L shape in which a rectangle of 70 mm×55 mm was cut out from the rectangle of 85 mm×70 mm was used.

The imaging apparatus equipped with the completed imaging unit 400 of Example 1 was able to sufficiently ensure the optical performance of the imaging element 27 which was a built-in CMOS image sensor.

Example 2

As an imaging unit of Example 2, the imaging unit 400, in which the printed wiring board 10 has the configuration illustrated in FIG. 3 in the configuration of the imaging unit 400 according to the fifth embodiment illustrated in FIGS. 5A and 5B, the printed wiring board 10, was manufactured.

In the imaging unit 400 of Example 2, the heat dissipation part 31 was arranged on the bonded portion between the flexible printed circuit board 1 and the printed wiring board 10 by the solder 5. The protruding portions 32, which were protruding projections, were formed on parts of the flexible printed circuit board 1 in the width direction, and a resin was applied as the reinforcing part 30 from above to fix each of the protruding portions 32 to the printed wiring board 10.

The same flexible printed circuit board as in Example 1 was used as the flexible printed circuit board 1. As the printed wiring board 10, the same one as in Example 1 was used except that the rectangular opening 90 and the elliptical opening 21 of the first region 51 were not formed.

The graphite sheet was used as the heat dissipation part 31. The shape of the heat dissipation part 31 was a rectangular parallelepiped having a long side of 20 mm, a short side of 10 mm, and a height of 2.5 mm. Each of the protruding portion 32 of the flexible printed circuit board 1 was formed at a position of 0.5 mm in a direction opposite to the tip of the first electrode 71 of the flexible printed circuit board 1 from the end of the first electrode 71 of the flexible printed circuit board 1 on the coverlay 4 side. That is, each of the protruding portion 32 was formed at a position of 1.5 mm in the length direction of the flexible printed circuit board 1 from the tip of the first electrode 71. The reinforcing part 30 made of a semi-elliptic spherical ultraviolet curing resin having a diameter of about 3 mm and a height of about 1 mm was formed on each of the protruding portion 32. The heat dissipation part 31 was connected to a sheet metal in the housing. The sheet metal also functioned as a heat dissipation part.

The imaging apparatus equipped with the completed imaging unit 400 of Example 2 was able to sufficiently ensure the optical performance of the imaging element 27 which was a built-in CMOS image sensor. Further, in Example 2, since the heat dissipation part 31 was added, the heat generated in the connected portion 6 between the flexible printed circuit board 1 and the printed wiring board 10 was able to be dissipated, and the influence on the peripheral component 40 was able to be further reduced. Further, in Example 2, the protruding portions 32 were formed on the flexible printed circuit board 1, and the protruding portions 32 were reinforced by the reinforcing parts 30 made of an ultraviolet curing resin. Therefore, in Example 2, the load on the connected portion 6 between the flexible printed circuit board 1 and the printed wiring board 10 was able to be reduced simultaneously with countermeasures against heat.

According to the present invention, in the electronic module in which the flexible printed wiring board is connected to the printed wiring board by soldering, it is possible to provide a technique capable of suppressing the influence of heat on peripheral component mounted on the printed wiring board to be small and improving the heat dissipation performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-011144, filed Jan. 27, 2023, which is hereby incorporated by reference herein in its entirety.

What is claimed is:

1. An electronic module comprising:
   a flexible printed circuit board having a first electrode group;
   a printed wiring board having a second electrode group; and
   an electronic component mounted on the printed wiring board,
   wherein the printed wiring board includes a first conductive layer formed to include the second electrode group and a second conductive layer formed under the first conductive layer,
   wherein the first electrode group and the second electrode group are bonded by solder,
   wherein a plane including the second conductive layer includes a first region, a second region in contact with the first region via a first boundary, and a third region in contact with the second region via a second boundary in a plan view with respect to the plane,
   wherein the first region includes a reference region having a contour of a rectangle, and the reference region is set such that four sides of the rectangle are circumscribed to a bonded portion where the first electrode group and the second electrode group are bonded to each other in the plan view,
   wherein a first boundary portion, which is at least a part of the first boundary, is positioned within a range of 0.5 times or more and 5 times or less a length of a short side of the four sides in one direction from one side of the four sides of the reference region toward the outside of the reference region, wherein a second boundary portion, which is at least a part of the second boundary, is positioned within a range of 0.5 times or more and 5 times or less the length of the short side in the one direction from the first boundary portion, and wherein a density of the second conductive layer in the first region is higher than a density of the second conductive layer in the second region, and the electronic component is arranged on the third region.

2. The electronic module according to claim 1, wherein a density of the second conductive layer in a region excluding the reference region from the first region in the plan view is higher than a density of the second conductive layer in the reference region.

3. The electronic module according to claim 1, wherein a plurality of openings are formed in the second conductive layer in the second region.

4. The electronic module according to claim 1, wherein the plurality of openings includes a first opening and a second opening having an opening area smaller than that of the first opening.

5. The electronic module according to claim 4,
wherein the second conductive layer is continuous from the first opening to the first region, and
wherein the second conductive layer is continuous from the second opening to the first region.

6. The electronic module according to claim 4, wherein the first opening is closer to a center of a long side of the reference region than an edge of the long side.

7. The electronic module according to claim 1 comprising:
an electronic component arranged on the second region,
wherein the electronic component arranged on the second region has higher heat resistance than the electronic component arranged on the third region.

8. The electronic module according to claim 1, wherein the first boundary portion is positioned within a range of 1 times or more and 2 times or less the length of the short side in the one direction from the one side.

9. The electronic module according to claim 1, wherein the second boundary portion is positioned within a range of 1.5 times or more and 2.5 times or less the length of the short side in the one direction from the first boundary portion.

10. The electronic module according to claim 1, wherein the density of the second conductive layer in the first region is 50% or more in area ratio.

11. The electronic module according to claim 1, wherein a third opening is formed in the second conductive layer in the first region.

12. The electronic module according to claim 11, wherein the third opening is formed so as to overlap with a second electrode included in the second electrode group in the plan view.

13. The electronic module according to claim 12,
wherein the third opening has a plane shape having a short direction and a longitudinal direction,
wherein at least one of a length of the short direction of the third opening being within range of 1 times or more and 3 times or less the length of a short direction of the first electrode included in the first electrode group, and a length of the longitudinal direction of the third opening being within range of 1 times or more and 2 times or less the length of a longitudinal direction of the first electrode, is satisfied.

14. The electronic module according to claim 1, wherein the one side is a long side of the four sides.

15. The electronic module according to claim 1, wherein the second region and the flexible printed circuit board overlap each other in the plan view.

16. The electronic module according to claim 1,
wherein the one side is a first side and the one direction is a first direction,
wherein a third boundary portion, which is at least a part of the first boundary, is positioned within a range of 0.5 times or more and 5 times or less the length of the short side in a second direction from at least a second side of the four sides of the reference region to the outside of the reference region, and
wherein a fourth boundary portion, which is at least a part of the second boundary, is positioned within a range of 0.5 times or more and 5 times or less the length of the short side in the second direction from the third boundary portion.

17. The electronic module according to claim 16,
wherein a fifth boundary portion, which is at least a part of the first boundary, is positioned within a range of 0.5 times or more and 5 times or less the length of the short side in a third direction from at least a third side of the four sides of the reference region to the outside of the reference region, and
wherein a sixth boundary portion, which is at least a part of the second boundary, is positioned within a range of 0.5 times or more and 5 times or less the length of the short side in the third direction from the fifth boundary portion.

18. The electronic module according to claim 17,
wherein a seventh boundary portion, which is at least a part of the first boundary, is positioned within a range of 0.5 times or more and 5 times or less the length of the short side in a fourth direction from at least a fourth side of the four sides of the reference region to the outside of the reference region, and
wherein an eighth boundary portion, which is at least a part of the second boundary, is positioned within a range of 0.5 times or more and 5 times or less the length of the short side in the fourth direction from the seventh boundary portion.

19. The electronic module according to claim 1 comprising a heat dissipation part that covers the bonded portion,
wherein the flexible printed circuit board is provided between the heat dissipation part and the printed wiring board so that heat from the bonding portion is transferred to the heat dissipation part via the flexible printed circuit board.

20. The electronic module according to claim 1 comprising an imaging element mounted on the printed wiring board.

21. Equipment comprising:
a housing;
the electronic module according to claim 1 arranged inside the housing; and
a driving unit configured to move the printed wiring board inside the housing.

* * * * *